(12) United States Patent
Fujita et al.

(10) Patent No.: US 6,404,199 B1
(45) Date of Patent: Jun. 11, 2002

(54) QUADRATURE RF COIL FOR VERTICAL FIELD MRI SYSTEMS

(75) Inventors: Hiroyuki Fujita, Highland Heights; Gordon D. DeMeester, Wickliffe, both of OH (US)

(73) Assignee: Philips Medical Systems (Cleveland), Inc., Highland Heights, OH (US)

( * ) Notice: Subject to any disclaimer, the term of this patent is extended or adjusted under 35 U.S.C. 154(b) by 0 days.

(21) Appl. No.: 09/473,070

(22) Filed: Dec. 28, 1999

Related U.S. Application Data

(63) Continuation-in-part of application No. 09/200,168, filed on Nov. 25, 1998, now Pat. No. 6,169,401.

(51) Int. Cl.[7] .................................................. G01V 3/00
(52) U.S. Cl. ........................ 324/318; 324/307; 324/309
(58) Field of Search .............................. 324/318, 319, 324/307, 309

(56) References Cited

U.S. PATENT DOCUMENTS

| | | | | |
|---|---|---|---|---|
| 4,816,765 | A | | 3/1989 | Boskamp ..................... 324/318 |
| 4,918,388 | A | | 4/1990 | Mehdizadeh et al. ....... 324/322 |
| 5,030,915 | A | | 7/1991 | Boskamp et al. ........... 324/318 |
| 5,194,811 | A | * | 3/1993 | Murphy-Boesch et al. . 324/322 |
| 5,578,925 | A | | 11/1996 | Molyneaux et al. ........ 324/318 |
| 5,696,449 | A | | 12/1997 | Boskamp ..................... 324/318 |
| 5,898,306 | A | | 4/1999 | Liu et al. ..................... 324/322 |
| 5,923,169 | A | | 7/1999 | Ehnholm et al. ............ 324/319 |
| 6,029,082 | A | * | 2/2000 | Srinivasan et al. .......... 324/318 |
| 6,043,658 | A | * | 3/2000 | Leussier ....................... 324/318 |
| 6,169,401 | B1 | * | 1/2001 | Fujita et al. ................. 324/318 |

OTHER PUBLICATIONS

"Vertical Field Open RF Body Coils", Boskamp, et al., Proceedings of the ISMRM p. 736, 1999.
"A Degenerate Bandpass Ladder Network for Spine Imaging in Lateral Magnetic Fields", Boskamp, et al., Proceedings of the ISMRM p. 2024, 1998.
"Circular Polarized RF Coils for Open Magnet Systems", Viohl, Proceedings of the Society of Magnetic Resonance, p. 183, Nice France 8/19–25/1995.

* cited by examiner

*Primary Examiner*—Hezron Williams
*Assistant Examiner*—Dixomara Vargas
(74) *Attorney, Agent, or Firm*—Fay, Sharpe, Fagan, Minnich & McKee, LLP

(57) ABSTRACT

A quadrature RF coil assembly (48) is employed for quadrature excitation and/or reception in an open or vertical field magnetic resonance apparatus. The quadrature RF coil (48) includes a plurality of parallel rung elements (70, 72, 74, 76, 78). A pair of electrical conductive end segments (80, 82) connect the plurality of rung elements. Capacitive elements ($C_V$, $C_A$) interrupt a central rung element and the end segments. Preferably, the capacitive elements ($C_V$, $C_A$) are arranged in a high-pass configuration such that the two highest resonant modes, an odd mode (90) and an even mode (92), are tuned to have peak responsivity to a common imaging frequency. The odd mode (90) is responsive to magnetic fields which are normal to the coil (48), while the even mode is responsive to magnetic fields which are parallel to the coil (48) and perpendicular to the main magnetic field. In one embodiment, the quadrature coil (48) is curved such that it is partially wrapped around a portion of a subject (100) with the rung elements of the coil (48) parallel to the main magnetic field $B_0$. The quadrature coil (48) provides improved $B_1$ field uniformity and greater tuning stability due to reduced localized electric field effects. The coil (48) provides greater accessibility for interventional procedures conducted in a vertical field or open magnetic resonance imaging system.

16 Claims, 3 Drawing Sheets

QUADRATURE RF COIL FOR VERTICAL FIELD MRI SYSTEMS

This application is a continuation-in-part of U.S. application Ser. No. 09/200,168, filed Nov. 25, 1998, m now U.S. Pat. No. 6,169,401.

BACKGROUND OF THE INVENTION

The present invention relates to the magnetic resonance arts. It finds particular application in conjunction with magnetic resonance imaging and open magnetic resonance imaging systems and will be described with particular reference thereto. However, it is to be appreciated that the present invention will also find application in conjunction with other magnetic resonance imaging and spectroscopy systems, particularly those in which the direction of the main magnetic field is in the plane of the radio frequency coils.

Conventionally, magnetic resonance imaging procedures include disposing the patient in a substantially uniform, temporally constant main magnetic field $B_0$. The resulting magnetization of the sample is manipulated with radio frequency magnetic fields which are applied to the examination region so as to resonate polarized dipoles and produce magnetic resonance signals. The signals are received and used to produce images or spectra from the sample.

The direction of the main magnetic field in a high field system is generated along the central bore of an annular magnet assembly, i.e., the $B_0$ field aligns with the central axis of the patient. In bore-type systems, ladder RF coils have been utilized for quadrature detection. For such systems, U.S. Pat. No. 5,898,306 by H. Liu and C. Truwit describes a ladder resonator quadrature surface coil which is a low-pass configuration. The coil consists of uniformly spaced axial conductive elements, rungs, sandwiched between two conductive end elements. The low-pass ladder coil described generates quadrature magnetic RF fields $B_1$ from two resonant modes of the structure. One of the $B_1$ fields is oriented perpendicular to the plane of the coil and the other is oriented in the direction of the end conductors, perpendicular to the rungs. By properly orienting the coil in the plane of the patient, both modes generate $B_1$ fields perpendicular to the $B_0$ field. In this orientation, the coil receives and transmits resonant RF signals in quadrature.

The Liu coil describes rung elements which are interrupted by a plurality of capacitive elements arranged in a symmetric low-pass configuration. The coil detects both even and odd current modes in the lower resonant frequencies. The tuning capacitor values are often quite small—on the order of a picofarad. This results in coil tuning instability.

In addition, a symmetrical degenerate band-pass configuration has been described by Boskamp, et al. Tuning of such a band-pass coil is achieved by adjusting capacitive elements in both the rung and end conductors. This tuning process tends to be time-consuming, hence expensive.

However, not all magnetic resonance systems employ a horizontal $B_0$ magnetic field. Vertical field or open magnetic resonance imaging systems typically include a pair of parallel disposed pole pieces, which are often interconnected by a ferrous flux return path. Electrical coils for inducing the vertical main magnetic field are disposed along the flux return path or at the poles. Typically, the pole pieces are positioned horizontally such that a vertical field is created therebetween. Many advantages are realized with the use of open vertical field systems, such as openness for patient comfort and greater patient accessibility for the physician.

The RF coils used to manipulate magnetization as well as receive the magnetic resonance signals are different for vertical field open systems than for bore type systems. In a vertical field system, the $B_0$ orientation is directed across the patient as opposed to along the long axis of the patient, from head to toe. Useful RF fields, either linear or quadrature, are oriented perpendicular to the $B_0$ field. Thus, vertical field systems have used solenoid coils oriented along the patient axis to detect one orientation of field and a saddle coil or Helmholtz pair to detect an orthogonal transverse field. It is also desirable to have coils that conform to the openness requirements of the magnet. Volume coils for a bore type machine are often cylindrical, similar to the magnet bore. RF coils for a vertical field system are often sheets parallel to the pole faces to maintain the desired openness of the magnet. Transmit RF coils for open systems often include a pair of butterfly coils mounted parallel to the poles of the magnet. This conforms well to the open uses of the system while providing for quadrature excitation.

Early vertical field systems had a $B_0$ field of 0.2 to 0.35 Tesla with hydrogen magnetic resonance at frequencies of roughly 8 to 15 MHz. As field strength increases, the resonance frequency increases proportionally, requiring different coil design techniques. At low fields, solenoids and current loop coils are often used, whereas at higher frequencies, resonant structures, such as birdcage or ladder coils, are used. Also, at low fields, the receive coil thermal noise dominates while at magnetic fields of 1 Tesla or more, patient thermal noise dominates. Consequently, in high field systems, smaller receive coils or arrays of smaller coils are used to limit the patient volume contributing to the noise. Quadrature coils are usually used at higher fields because the patient noise seen by the orthogonal coils is also orthogonal resulting in a combined receive coil signal-to-noise improvement.

The present invention contemplates a new and improved open quadrature high-pass RF surface coil which overcomes the above difficulties and others.

SUMMARY OF THE INVENTION

In accordance with one aspect of the present invention, an open magnetic resonance apparatus generates a temporally constant main magnetic field through an examination region. An RF transmitter transmits radio frequency pulses to a quadrature radio frequency coil to excite resonance in selected dipoles in the examination region such that the dipoles generate resonance signals at a characteristic resonance frequency. A quadrature radio frequency coil assembly receives the resonance signals from the resonating dipoles and a radio frequency receiver demodulates the resonance signals received from the quadrature RF coil. The quadrature RF coil includes a plurality of parallel rung elements disposed parallel to the main magnetic field. Electrical conductive ends connect the plurality of rung elements. A plurality of capacitive elements interrupt at least one of the rung elements and ends.

In accordance with another aspect of the present invention, a quadrature high-pass ladder coil for a magnetic resonance apparatus includes a central rung element which is interrupted by at least one central rung capacitive element. A plurality of rung elements are disposed parallel to and symmetrically on each side of the central rung element. Further, a pair of electrical conductive ends interconnect the rung elements where the ends are each interrupted by a plurality of capacitive elements.

In accordance with another aspect of the present invention, a method of magnetic resonance imaging in an open MRI system is provided in which a temporally constant main magnetic field is generated through an examination region and gradient magnetic fields are generated for spatial selection and position encoding. The method includes positioning a quadrature RF ladder coil parallel to the main magnetic field, said coil supporting two resonant modes. Further, the two resonant modes are matched to a common resonance frequency of the dipoles of interest. Magnetic resonance is excited in the dipoles of interest in the examination region and induced magnetic resonance signals are detected using the quadrature RF ladder coil. The detected signals which are at and above the common imaging frequency are passed to a receiver and reconstructed into an image representation.

One advantage of the present invention is that it provides a planar RF transmitter particularly adapted for use at higher fields.

Another advantage of the present invention is that it allows for quadrature excitation and/or reception within the examination volume.

Another advantage of the present invention is that it provides a better signal-to-noise ratio in higher vertical field systems.

Another advantage of the present invention is that it provides better $B_1$ field uniformity.

Another advantage of the present invention resides in its ease of manufacture.

Another advantage of the present invention resides in an optimized current distribution that supports both even and odd current distributions.

Yet another advantage of the present invention is the ease of tuning due to reduced localized electric field effects that can lead to tuning instability.

Another advantage of the present invention is that it allows for a more open RF coil for vertical field systems.

Another advantage of the present invention is that it facilitates surgeon and attendant access for interventional procedures.

Other benefits and advantages of the present invention will become apparent to those skilled in the art upon a reading and understanding of the preferred embodiment.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESICCATION OF THE PREFERRED EMBODIMENTS

Figure 1:
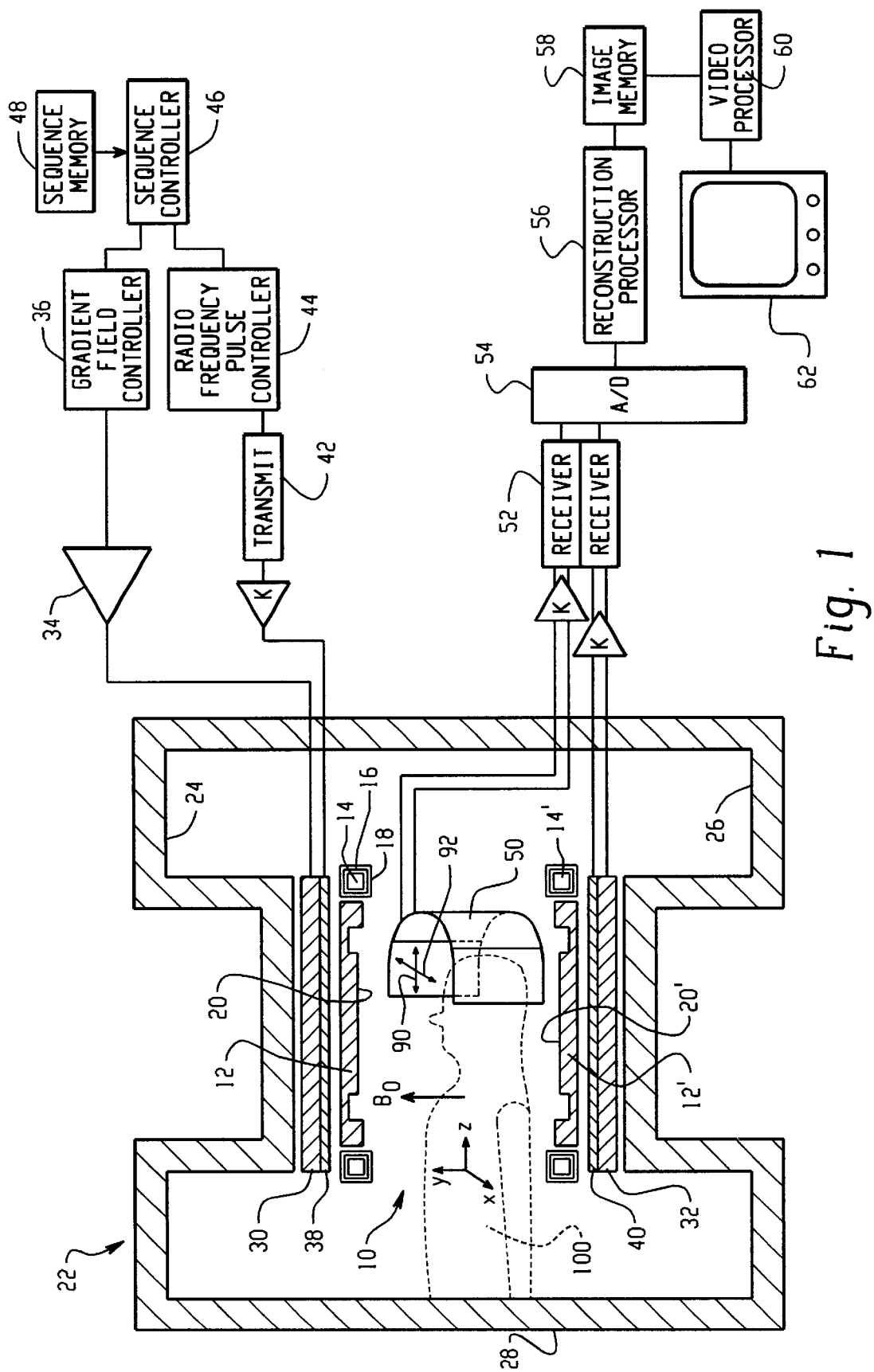
FIG. 1 is a diagrammatic illustration of a magnetic resonance imaging system in accordance with the present invention.

With reference to FIG. 1, in an open MRI system, an imaging or examination region 10 is defined between pole pieces 12, 12'. The first or upper pole piece 12 is surrounded by an annular magnet 14, preferably a superconducting magnet. To this end, the magnet is disposed in an annular helium container or can 16 that is surrounded by a vacuum dewar 18. The pole piece 12 is preferably circularly symmetric or oval with a symmetrically contoured face 20.

A second, lower pole piece 12' is disposed below the upper pole piece 12 and on the other side of the examination region 10. The second pole piece is again surrounded by a superconducting magnet 14' and has a contoured pole face 20' for improving magnetic field linearity in the examination region 10.

The pole pieces are disposed centrally in an RF room 22 which is defined by or lined with iron, including a ceiling layer 24, a floor layer 26, and a wall layer 28. The ceiling, floor, and wall layers are composed of multiple sections which are mechanically connected together such that they define a ferrous flux return path. The superconducting magnets 14, 14' induce magnetic flux in the ferrous flux return path and the $B_0$ field through the examination region. It is to be appreciated that the open MRI system may operate with or without pole pieces and with or without a flux return path.

For imaging, magnetic field gradient coils 30, 32 are disposed on either side of the examination region 10, near the pole pieces 12, 12'. In the preferred embodiment, the gradient coils are planar coil constructions which are connected by gradient amplifiers 34 to a gradient magnetic field controller 36. The gradient magnetic field controller 36 causes current pulses which are applied to the gradient coils such that gradient magnetic fields are superimposed on the temporally constant and uniform magnetic field throughout the examination region. The gradient fields create magnetic field gradients in the examination region 10 along a longitudinal or z-axis, a vertical or y-axis, and a transverse or x-axis.

In order to excite magnetic resonance in dipoles of a subject disposed in the examination region 10, radio frequency coils 38, 40 typically are included between the gradient coils 20, 22 and the imaging region 10. At least one radio frequency transmitter 42, preferably a digital transmitter, causes the radio frequency coils to transmit radio frequency pulses requested by a radio frequency pulse controller 44 to be transmitted into the imaging region 10. A sequence controller 46, under operator control, retrieves an imaging sequence from a sequence memory 48. The sequence controller 46 provides the sequence information to the gradient controller 36 and the radio frequency pulse controller 44 such that radio frequency and gradient magnetic field pulses in accordance with the selected sequence are generated.

Typically, the radio frequency coils 38, 40 are general purpose coils that provide excitation of nuclei in the imaging region 10 and are suitable for receiving resonance signals. On the other hand, specialty surface coils are often employed for greater flexibility. Typically, such coils are removable and may be the only radio frequency coils in the system or may be receive only coils.

With continuing reference to FIG. 1, a quadrature radio frequency coil 50 is positioned between the pole pieces 12, 12', adjacent the imaging region 10. As shown in FIG. 1, the quadrature radio frequency coil 50 is disposed such that the rungs are perpendicular to the pole pieces 12, 12'. The quadrature RF coil 50 is capable of RF transmission and/or reception in quadrature. At least one RF transmitter 42, preferably a digital transmitter, causes the quadrature RF coil 50 to transmit RF pulses into the examination region 10, exciting magnetic resonance in dipoles of interest. The quadrature RF coil 50 receives magnetic resonance signals which are demodulated by one or more receivers 52, preferably digital receivers. Signals from analog receivers are digitized with an analog-to-digital converter 54. The digitized signals are processed by a reconstruction processor 56 into volumetric or other image representations which are stored in a volumetric image memory 58. A video processor 60, under operator control, withdraws selected image data from the volume memory and formats it into appropriate format for display on a human-readable display 62, such as a video monitor, active-matrix monitor, liquid crystal display, or the like.

Figure 2:
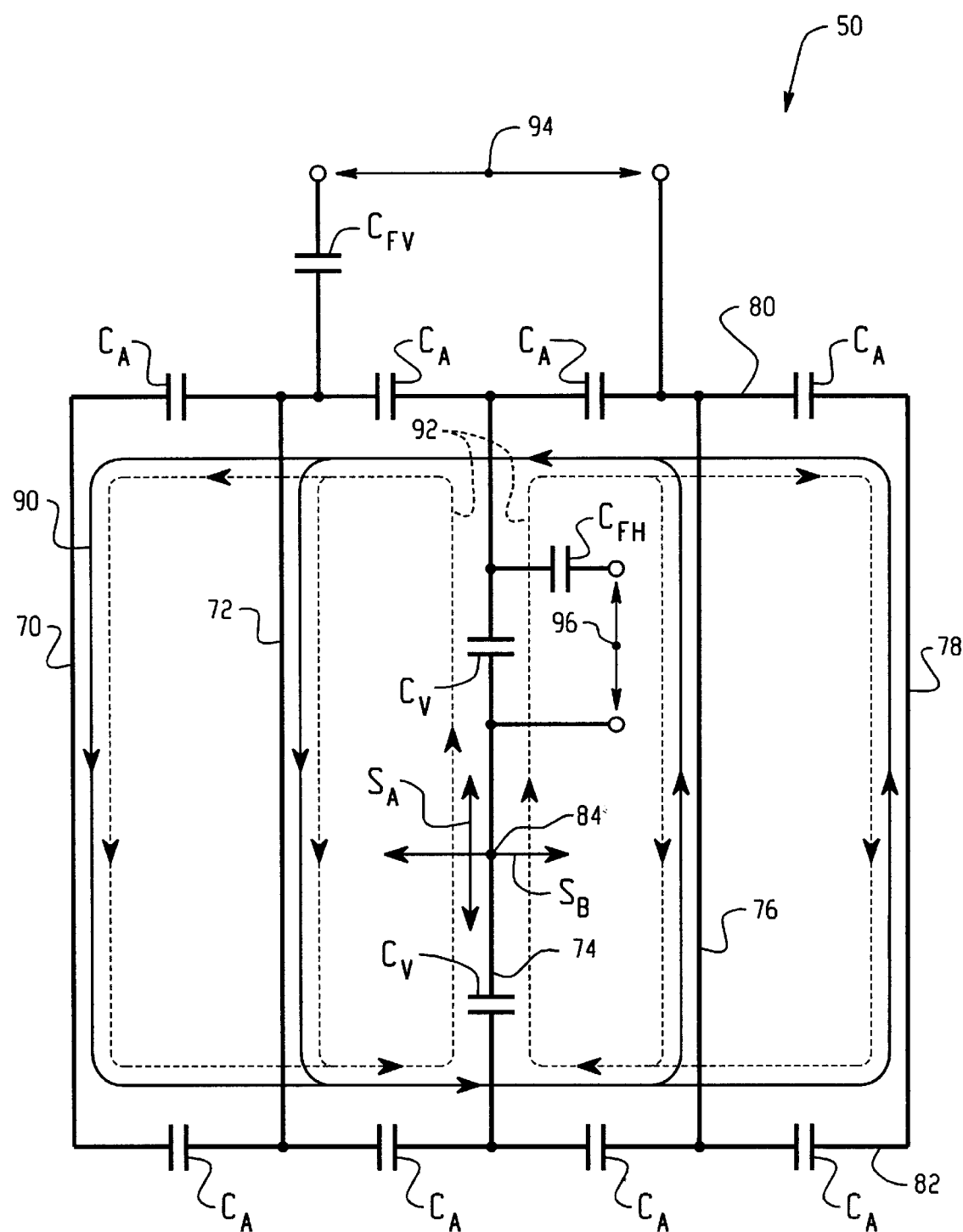
FIG. 2 is a diagrammatic illustration of an exemplary high-pass RF ladder coil in accordance with the present invention.

With reference to FIG. 2, the quadrature RF coil 50 includes an odd number of rung elements. In the preferred embodiment, there are five rung elements, 70, 72, 74, 76, and 78. The rung elements are interconnected by end segments 80, 82, which are interrupted with capacitors $C_A$ between each pair of rung elements. The central rung element, 74 in the preferred embodiment, is interrupted with a pair of capacitors $C_V$. The capacitive elements are selected such that the capacitive distribution is symmetric about a central point 84 of the coil along a direction $S_A$ parallel to the rung element and is also symmetric about the center point in a direction $S_B$ parallel to the end segments. It is to be appreciated that the coil 50 may be tuned to the desired frequency of interest by varying the numbers, positions, and values of capacitors around each coil. Further, it should be appreciated that the uniformity of the $B_1$ field will improve as more rung elements are added to the ladder coil.

The illustrated coil supports four different intrinsic resonance modes. In the preferred embodiment, the two highest resonance modes are selected for quadrature reception. of these modes, the odd mode 90 and the even mode 92 are of particular interest. The odd mode 90 is defined by currents flowing peripherally in a loop-like path, but divided among the rung elements to either side of the central rung element. In other words, the odd mode 90 does not carry currents on the center rung. Thus, when a capacitor is placed on the center rung, the odd mode is not sensitive to changes in capacitance. The even mode 92 is defined by two counter-rotating current loops which flow in the same direction through the central rung element 74 and are divided among the other rung elements defining the return portions of the two loops. In other words, the even mode 92 carries maximum current on the center rung so that the even mode is sensitive to capacitance changes on the center rung. The odd mode 90 is responsive to magnetic fields in the direction normal to the plane of the coil. The even mode 92 is responsive to magnetic fields which are perpendicular to the odd mode 90 and the $B_0$ field. The values of capacitances $C_A$ are selected to be not only symmetric about the center point 84, but also such that the odd mode has a resonant frequency that is the same as the resonant frequency of the imaged dipole of the system. The capacitances $C_V$ and $C_A$ are selected to be not only symmetric about the center point 84, but such that the even mode has the resonant frequency of the dipole of interest. While in the preferred embodiment, the two resonant modes are tuned to a single frequency of interest for imaging applications, it is to be appreciated the the two modes may be tuned to different frequencies for spectroscopy applications.

The quadrature coil 50 has an output port 94 for the even mode 92 and an output port 96 for the odd mode 90. A matching capacitor $C_{FV}$ is associated with the output port 94 for the even mode and the matching capacitor $C_{FH}$ is associated with the output port 96 for the odd mode.

With continued reference to FIG. 2, it is significant that the quadrature surface coil is configured as a high-pass ladder structure RF coil. The selection of the high-pass mode enables selection or use of capacitive elements having larger capacitance values than those needed for a low-pass or band-pass coil. These capacitors correspondingly reduce the electric field surrounding the subject, which reduces instability in coil tuning. It is to be appreciated that the size of the capacitances depends on the size of the quadrature RF coil.

Figure 3:
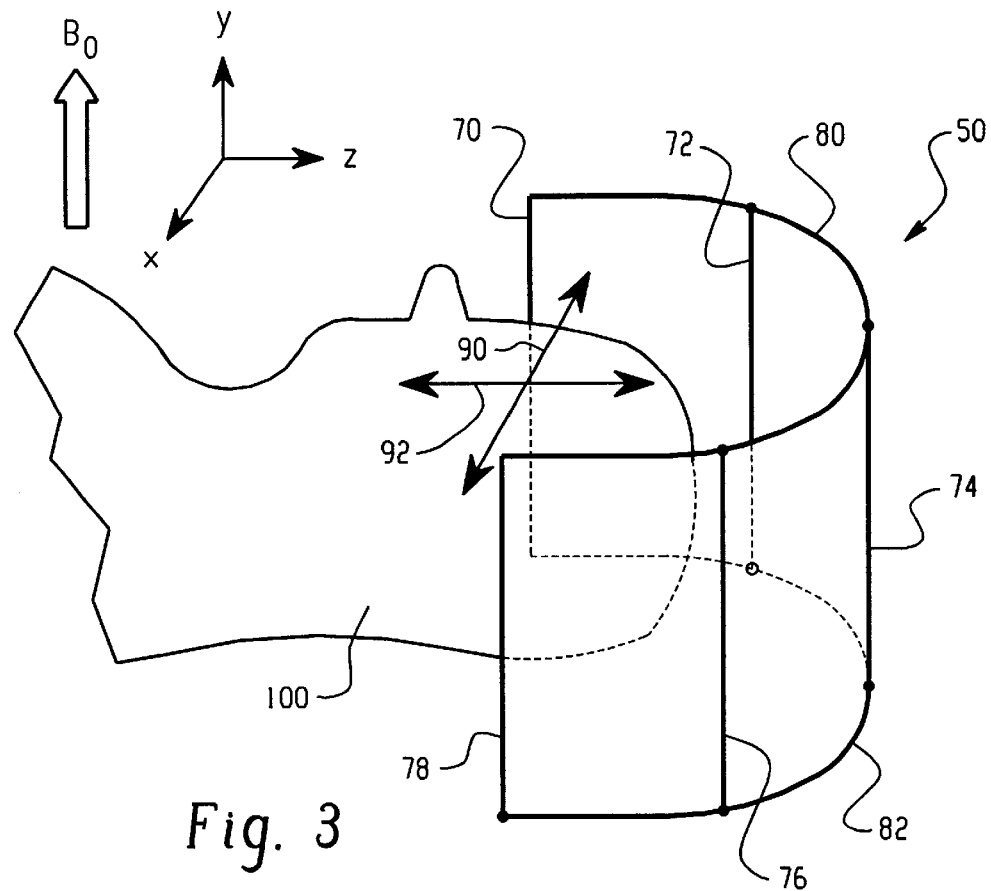
FIG. 3 is a perspective illustration of a flexible RF ladder coil to be used for head imaging in accordance with the present invention.
Figure 4:
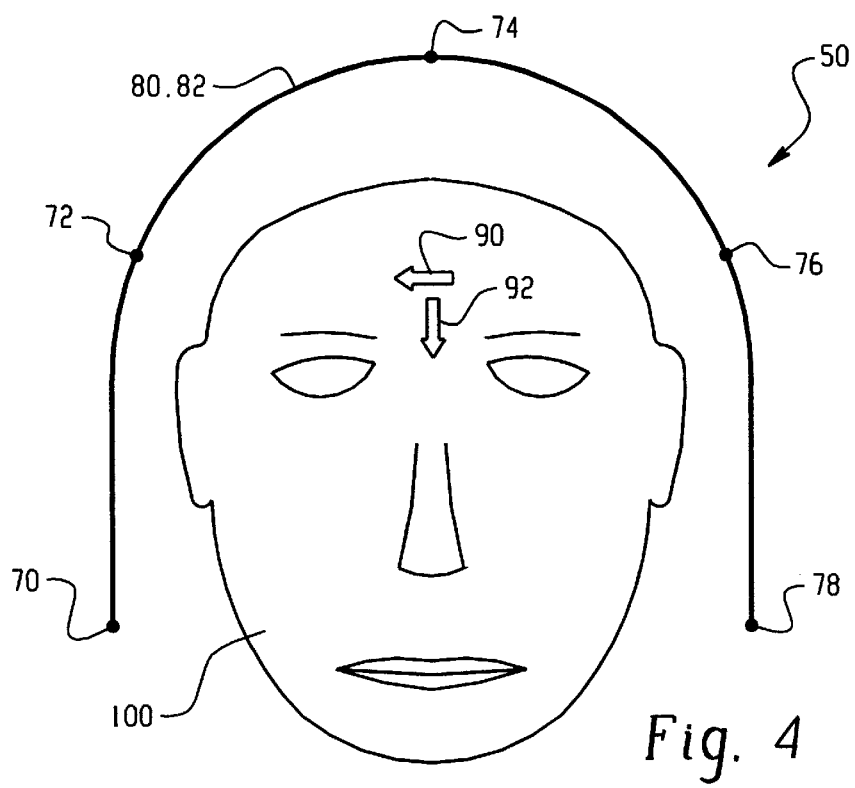
FIG. 4 is a top view of the coil of FIG. 3.

With reference to FIGS. 3 and 4, and continuing reference to FIG. 2, an embodiment of the present invention is provided where the quadrature coil 50 is non-planar. Preferably, the coil is partially wrapped around a portion of the subject 100, in the illustrated case, the head of the subject. In one embodiment, the quadrature coil is constructed of copper strips which are mounted onto a flexible support sheet, such as plastic. As shown in FIG. 3, the rung elements or legs of the quadrature coil are parallel to the main magnetic field $B_0$. The open nature of the quadrature coil facilitates easy surgeon access to the subject through the coil during interventional procedures.

It is to be appreciated that a phased array may be obtained by overlapping several quadrature surface coils in a given direction by an amount which minimizes the mutual inductance. Those skilled in the art will recognize that the multiple distributed phased array coil covers a broader imaging region and improves the signal-to-noise ratio as compared to a single coil covering a comparable area.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. An open magnetic resonance apparatus which includes an examination region for receiving a subject oriented along a subject axis, a main magnet which generates a temporally constant main magnetic field in a direction orthogonal to the subject axis, an RF transmitter which transmits radio frequency pulses to a quadrature radio frequency coil to excite resonance in selected dipoles in the examination region such that the dipoles generate resonance signals at a characteristic resonance frequency, a quadrature radio frequency coil assembly which receives the resonance signals from the resonating dipoles, and a radio frequency receiver for demodulating the resonance signals received from the quadrature RF coil, the quadrature RF coil comprising:

a plurality of parallel rung elements disposed orthogonal to the subject axis and parallel to the main magnetic field;

electrical conductive ends connecting the plurality of rung elements; and a plurality of capacitive elements interrupting at least one of the rung elements and ends.

2. The magnetic resonance apparatus according to claim 1, wherein the quadrature RF coil includes:

an odd number of rung elements not less than five, said rung elements being disposed symmetrically about a central rung element.

3. The magnetic resonance apparatus according to claim 1, wherein a central one of the rung elements and the ends are interrupted by a plurality of capacitive elements, the central rung and end capacitive elements being disposed symmetrically about a midpoint on the central rung element such that an even mode is produced which is parallel to a plane of the coil and an odd mode is produced which is normal to the plane of the coil.

4. The magnetic resonance apparatus according to claim 1, wherein a central one of the rung elements and ends are interrupted by capacitive elements disposed symmetrically about a midpoint on the central rung element such that an even mode is responsive to a resonance signal component which is perpendicular to the rung elements of the coil and an odd mode is responsive to a resonance signal component which is normal to the plane of the coil.

5. The magnetic resonance apparatus according to claim 4, wherein the quadrature RF coil further comprises:
   a sampling port electrically connected in parallel to at least one of the central rung capacitive elements through which the even mode is sampled.

6. The magnetic resonance apparatus according to claim 5, wherein the quadrature RF coil further comprises:
   a sampling port electrically connected in parallel to two of the end capacitive elements symmetrically about the central rung element through which the odd mode is sampled.

7. The magnetic resonance apparatus according to claim 1, wherein the rung elements each have a length which is substantially equal to a length of the ends.

8. The magnetic resonance apparatus according to claim 1, wherein the rung elements and ends are copper strips mounted on a flexible insulator support sheet.

9. An open magnetic resonance apparatus having an examination region which receives a patient horizontally through which a temporally constant main magnetic field is generated vertically, an RF transmitter which transmits radio frequency pulses to a quadrature radio frequency coil to excite resonance, a quadrature radio frequency coil assembly which receives the resonance signals from the resonating dipoles, and a radio frequency receiver for demodulating the resonance signals received from the quadrature RF coil, the quadrature RF coil comprising:
   a plurality of parallel conductive rung elements connected by electrical conductive ends, the rung elements and ends being mounted on a flexible insulator support sheet which is curved such that it is partially wrapped around a top portion of a head of a subject disposed in the examination region with the rungs disposed parallel to the main magnetic field; and
   a plurality of capacitive elements interrupting at least one of the rung elements and the ends.

10. The magnetic resonance apparatus according to claim 4, wherein the rung elements of the quadrature RF coil are positioned parallel to the main magnetic field such that the even mode and odd mode of the coil are perpendicular to the main magnetic field.

11. In a magnetic resonance system in which a main magnetic field is generated vertically through a subject disposed horizontally within an examination region, a quadrature high-pass ladder coil disposed vertically adjacent the subject, said ladder coil comprising:
   a vertically oriented central rung element interrupted by at least one central rung capacitive element;
   a plurality of rung elements disposed parallel to and symmetrically on each side of the central rung element; and
   a pair of horizontally oriented electrical conductive ends interconnecting rung elements, said ends each being interrupted by a plurality of capacitive elements.

12. The quadrature high-pass ladder coil according to claim 11, wherein the central rung and end capacitive elements support two frequency modes, an even mode responsive to radio frequency fields perpendicular to the rung elements of the coil and an odd mode responsive to radio frequency fields normal to the plane of the coil.

13. The quadrature high-pass ladder coil according to claim 12, wherein the odd and even modes have peak responsivity to a common frequency.

14. The quadrature high-pass ladder coil according to claim 11, further comprising:
   an even mode sampling port electrically connected across one of the central rung capacitive elements; and
   an odd mode sampling port electrically connected across side capacitive elements symmetrically about the central rung element.

15. A method of magnetic resonance imaging in an open MRI system in which a temporally constant main magnetic field is generated through an examination region in which a subject is disposed horizontally and gradient magnetic fields are generated for spatial selection and position encoding, the method including:
   (a) positioning a quadrature RF ladder coil in a curved orientation, parallel to the vertical main magnetic field, said coil supporting an even resonant mode and an odd resonant mode;
   (b) matching the tow resonant modes to a common resonance frequency of dipoles of interest;
   (c) exciting magnetic resonance in the dipoles of interest in the examination region;
   (d) detecting induced magnetic resonance signals using the quadrature RF ladder coil;
   (e) passing detected signals at the common imaging frequency to a receiver; and
   (f) reconstructing the received magnetic resonance signals into an image representation.

16. The method according to claim 15, wherein the quadrature RF ladder coil includes a plurality of parallel rung elements aligned with the main magnetic field, the rung elements being interconnected by a pair of end segments; a central rung element being interrupted by at least one capacitive element, wherein the matching step includes:
   adjusting an effective reactance of at least one portion of the quadrature RF ladder coil such that an even mode and an odd mode have peak responsivity at the common resonance frequency.

* * * * *